United States Patent
Balseanu et al.

(10) Patent No.: US 8,563,090 B2
(45) Date of Patent: Oct. 22, 2013

(54) BORON FILM INTERFACE ENGINEERING

(75) Inventors: Mihaela Balseanu, Sunnyvale, CA (US); Li-Qun Xia, Cupertino, CA (US); Derek R Witty, Fremont, CA (US); Yi Chen, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 572 days.

(21) Appl. No.: 12/489,124

(22) Filed: Jun. 22, 2009

(65) Prior Publication Data

US 2010/0098884 A1    Apr. 22, 2010

Related U.S. Application Data

(60) Provisional application No. 61/106,076, filed on Oct. 16, 2008.

(51) Int. Cl.
  *C23C 16/34* (2006.01)
  *C23C 16/38* (2006.01)

(52) U.S. Cl.
  USPC ................................................ 427/419.1

(58) Field of Classification Search
  USPC ................................................ 427/419.1
  See application file for complete search history.

(56) References Cited

U.S. PATENT DOCUMENTS

| | | | |
|---|---|---|---|
| 3,451,840 A | 6/1969 | Hough | |
| 4,571,819 A | 2/1986 | Rogers et al. | |
| 4,656,052 A | 4/1987 | Satou et al. | |
| 5,270,125 A | 12/1993 | America et al. | |
| 5,306,530 A | 4/1994 | Strongin et al. | |
| 5,316,804 A | 5/1994 | Tomikawa et al. | |
| 5,483,920 A | 1/1996 | Pryor | |
| 5,534,070 A | 7/1996 | Okamura et al. | |
| 5,536,360 A | 7/1996 | Nguyen et al. | |
| 5,626,922 A | 5/1997 | Miyanaga et al. | |
| 5,897,751 A | 4/1999 | Makowiecki | |
| 6,121,161 A * | 9/2000 | Rossman et al. | 438/783 |
| 6,531,377 B2 | 3/2003 | Knorr et al. | |
| 6,759,261 B2 | 7/2004 | Shimokohbe et al. | |
| 6,958,175 B2 | 10/2005 | Sakamoto et al. | |
| 7,081,414 B2 | 7/2006 | Zhang et al. | |
| 7,205,240 B2 | 4/2007 | Karim et al. | |
| 7,910,491 B2 | 3/2011 | Soo Kwon et al. | |
| 2002/0197823 A1 | 12/2002 | Yoo et al. | |
| 2003/0224217 A1 | 12/2003 | Byun et al. | |

(Continued)

FOREIGN PATENT DOCUMENTS

| KR | 10-2000-0020909 | * | 4/2000 |
| KR | 10-2000-0020909 A | | 4/2000 |

OTHER PUBLICATIONS

Iijima, Yukio et al., "Highly Selective SiO2 Etch Employing Inductively Coupled Hydro-Fluorocarbon Plasma Chemistry for Self Aligned Contact Etch", Jpn. J. Appl. Phys., vol. 36, Part 1, No. 9A, Sep. 1997, pp. 5498-5501.

(Continued)

*Primary Examiner* — Nathan Empie (74) *Attorney, Agent, or Firm* — Kilpatrick Townsend & Stockton LLP (57) ABSTRACT

Methods of depositing boron-containing liner layers on substrates involve the formation of a bilayer including an initiation layer which includes barrier material to inhibit the diffusion of boron from the bilayer into the underlying substrate.

11 Claims, 5 Drawing Sheets

(56) References Cited

U.S. PATENT DOCUMENTS

| | | |
|---|---|---|
| 2004/0029353 A1 | 2/2004 | Zheng et al. |
| 2004/0245091 A1 | 12/2004 | Karim et al. |
| 2005/0048801 A1 | 3/2005 | Karim et al. |
| 2005/0167742 A1* | 8/2005 | Challa et al. ............... 257/328 |
| 2006/0019486 A1 | 1/2006 | Yu et al. |
| 2006/0207504 A1 | 9/2006 | Hasebe et al. |
| 2007/0197028 A1 | 8/2007 | Byun et al. |
| 2008/0176390 A1 | 7/2008 | Cheng |
| 2008/0292798 A1 | 11/2008 | Huh et al. |
| 2010/0099236 A1 | 4/2010 | Kwon et al. |

OTHER PUBLICATIONS

PCT International Search Report and Written Opinion mailed Dec. 30, 2010; International Application No. PCT/US2010/038713, 10 pages.

PCT International Search Report and Written Opinion mailed Apr. 30, 2010, International Application No. PCT/US2009/058832, 13 pages.

* cited by examiner

BORON FILM INTERFACE ENGINEERING

CROSS-REFERENCES TO RELATED APPLICATIONS

This application is related to U.S. patent application Ser. No. 11/765,257 and U.S. Prov. Pat. App. Ser. No. 61/042,638, both titled "BORON NITRIDE AND BORON NITRIDE-DERIVED MATERIALS DEPOSITION METHOD." This application is also related to U.S. Prov. Pat. App. Ser. No. 61/106,076 filed Oct. 16, 2008 titled "GAPFILL IMPROVEMENT WITH HIGH LOW ETCH RATE DIELECTRIC LINERS."

FIELD

This application relates to manufacturing technology solutions involving equipment, processes, and materials used in the deposition, patterning, and treatment of thin-films and coatings, with representative examples including (but not limited to) applications involving: semiconductor and dielectric materials and devices, silicon-based wafers and flat panel displays (such as TFTs).

BACKGROUND OF THE INVENTION

Increasing the density of integrated circuits can increase speed and enable new applications. The increased density can increase undesirable electrical interactions between adjacent circuit elements and conducting lines. Unwanted interactions are typically prevented by providing trenches that are filled with electrically insulating material to isolate the elements both physically and electrically. As circuit densities increase, however, the widths of these trenches decrease, increasing their aspect ratios and making it progressively more difficult to fill the trenches without leaving voids. A trench which is not completely filled is undesirable since the degree of isolation may be compromised which limiting the maximum operational frequency or otherwise adversely affect operation of the integrated circuit.

Common techniques that are used in gapfill applications are chemical-vapor deposition ("CVD") techniques. Conventional thermal CVD processes supply reactive gases to the substrate surface where thermally-induced chemical reactions take place to produce a desired film. Plasma-enhanced CVD ("PECVD") techniques promote excitation and/or dissociation of the reactant gases by the application of radio-frequency ("RF") energy to a reaction zone near the substrate surface creating a plasma. The high reactivity of the species in the plasma reduces any thermal energy required to promote a chemical reaction thereby lowering the temperature required for such CVD processes when compared with conventional thermal CVD processes. These advantages may be further exploited by high-density-plasma ("HDP") CVD techniques, in which a dense plasma is formed at low vacuum pressures so that ionized reactants form a greater portion of the total reactant population. The mean free path can be extended in HDP-CVD for the same density of ionized reactants and their impingement velocities can be increased in magnitude and directionally controlled. While each of these techniques falls broadly under the umbrella of "CVD techniques," each of them has characteristic properties that make them more or less suitable for certain specific applications.

Inclusion of boron in films grown with CVD techniques can lower the dielectric constant relative to silicon nitride, improving the electrical isolation provided by a trench filled with a boron-containing film. The dielectric constant may be reduced by an amount which varies based upon the amount of boron included, other elements present in the film and the particular deposition techniques employed. The presence of boron can also decrease the etch rate and cause other changes in film properties which may be desirable for a given step in a semiconductor manufacturing process sequence.

Especially for front-end processes, the presence of boron in a deposited film introduces a risk of migration of boron into the substrate. Boron is a common dopant used to affect the performance of the active region of a silicon transistor. The addition of boron may change a lightly doped region to a more heavily doped region and negatively affect the performance of a device. Therefore it is desirable to develop techniques for inhibiting the diffusion of boron into underlying layers.

BRIEF SUMMARY OF THE INVENTION

Aspects of the disclosure pertain to methods of depositing boron-containing liner layers on unpatterned or patterned substrates. In embodiments, the boron-containing liner layer is a bilayer including an initiation layer which includes barrier material to inhibit diffusion.

In one embodiment, the present disclosure provides a method of depositing a bilayer liner in a trench on a substrate in a processing chamber. The method includes forming an initiation layer having a thickness less than or about 15 Å and containing nitrogen and/or carbon. The method also includes forming a boron-containing layer on the initiation layer. The initiation layer reduces diffusion of boron from the boron-containing layer into the substrate.

In another embodiment, the present disclosure provides a method of depositing a bilayer liner on a surface of a substrate in a processing chamber. The method includes forming a layer of barrier material on an interior surface of the processing chamber, wherein the layer of barrier material contains nitrogen and/or carbon. The method further includes transferring the substrate into the processing chamber. The method further includes forming an initiation layer on the substrate by striking a plasma in the processing chamber to redistribute a portion of the diffusion-barrier material from the interior surface of the processing chamber onto the substrate. The initiation layer has a thickness less than or about 15 Å. The method further includes forming a boron-containing layer on the initiation layer.

Additional embodiments and features are set forth in part in the description that follows, and in part will become apparent to those skilled in the art upon examination of the specification or may be learned by the practice of the disclosed embodiments. The features and advantages of the disclosed embodiments may be realized and attained by means of the instrumentalities, combinations, and methods described in the specification.

BRIEF DESCRIPTION OF THE DRAWINGS

A further understanding of the nature and advantages of the disclosed embodiments may be realized by reference to the remaining portions of the specification and the drawings.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF THE INVENTION

Aspects of the disclosure pertain to methods of depositing boron-containing liner layers on unpatterned or patterned substrates. The boron-containing liner layer provides benefits pertaining to the performance of a device, the longevity of a device or the manufacturing process flow. In embodiments, the boron-containing liner layer is a bilayer including an initiation layer of barrier material to inhibit the diffusion of boron from the bilayer into the underlying substrate. For some substrates, the initiation layer may also inhibit the diffusion of material from the substrate into or across the bilayer.

The initiation layer may be formed directly on the substrate. Alternatively, the initiation layer may be formed by depositing barrier material on the inner surfaces of the processing chamber in the absence of a substrate. This process may be referred to as seasoning the chamber herein. The barrier material may be redeposited with a plasma process after the substrate is introduced into the processing chamber, thereby forming the initiation layer on the substrate. Alternatively, the initiation layer may be deposited by chemical vapor deposition (CVD). After the initiation layer is formed a boron-containing film is formed. The boron-containing film may be formed in the same chamber or a different processing chamber, with or without breaking vacuum thereby exposing the substrate to atmosphere.

Liner layers of boron-containing material is one application which may benefit from innovations described herein but other applications of boron-containing layers may also benefit. Suitable applications may be thin or thick films formed on unpatterned or patterned substrates. The initiation layers may generally be referred to as barrier layers or diffusion barrier layers. A patterned substrate may have a trench on the surface of the substrate. The walls of the trench may be homogeneous or the walls may be formed from two or more materials. In some cases a portion of the walls are formed from underlying substrate material. Front end processes like these are especially susceptible to boron diffusion.

Methods disclosed herein may include the formation of initiation layers prior to the formation of a subsequently deposited liner layer containing boron. The initiation layer may or may not contain boron. In disclosed embodiments, the migration of boron into the substrate is inhibited by applying an initiation layer prior to forming a boron-containing layer. In embodiments, the initiation layer inhibits the diffusion of material from the substrate into or across the bilayer. The initiation layer is interchangeably referred to as a barrier layer herein.

The first layer of a bilayer is the initiation layer or barrier layer. The initiation layer may include silicon nitride, silicon oxynitride, silicon carbide or nitrogen-rich boron nitride in different embodiments. Combinations of these materials and constituents may also provide utility as a barrier material for use as the initiation layer. The initiation layer may itself be a combination of two or more layers with one or more of the layers including a diffusion barrier material. Such an initiation layer is referred to herein as a heterogeneous initiation layer and some of the layers may include boron, phosphorous and other dopants to facilitate adhesion for example.

The layer following the initiation layer is a boron-containing liner layer and may be boron nitride (BN) but may also be boron oxide ($B_2O_3$) or boron carbide (BC). Other boron-containing liner layers may include boron silicon nitride (BSiN), boron silicon oxide (BSiO), boron carbon nitride (BCN), phosphorus boron nitride (PBN), silicon boron nitride (SiBN) and boron carbon silicon nitride (BCSiN) films. Again, combinations of these materials and constituents may provide utility as a liner layer in a bilayer according to disclosed embodiments.

The utility of bilayers discussed herein relate to properties of the boron-containing layer. Useful properties may include physical strength, chemical inertness, high-temperature stability, electrical insulation and high dielectric constant. Exemplary applications include "front-end" applications, such as spacer layers and strain-inducing layers used to control the stress of an underlying film. Boron-containing films in combination with barrier layers described herein may also be used to provide greater resistance to etch processes than a silicon nitride film. Bulk boron-containing films in combination with initiation layers may be used to fill trenches with a low-k dielectric, enhancing the electrical isolation between regions on either side of the trench compared with other high density gap-fill films.

Regardless of the application, barrier layers according to embodiments inhibit diffusion of boron across the layer. Without binding the subject matter described and claimed herein to theoretical hypotheses which may or may not be correct, some discussion of mechanism can be helpful in understanding the significance of the innovations described. The inhibition of boron diffusion may be caused by the high density of the initiation layer (e.g. silicon nitride) which provides low porosity and few boron bonding sites within the initiation layer. Such an initiation layer will inhibit boron diffusion across the layer. Barrier layers may even contain boron so long as the mobility of boron within the barrier layer is low. Low boron mobility may result from low porosity and/or forming the layer such that the boron contained within the film is generally bonded tightly to other constituents within the film. A nitrogen rich boron nitride layer is one way to bound the boron tightly in the barrier layer.

Figure 1:
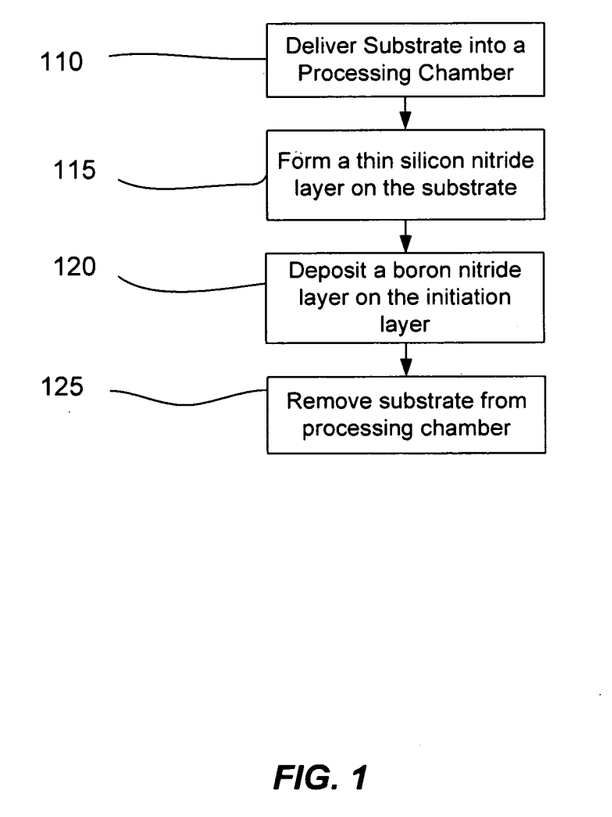
FIG. 1 is a flow chart of a deposition process of a boron-containing bilayer according to disclosed embodiments.

In order to better understand and appreciate the invention, reference is now made to FIG. 1 which is a flow chart of a deposition process of a boron-containing bilayer according to disclosed embodiments. The process begins with operation 110 in which a substrate is transferred into a processing chamber. A thin conformal initiation layer of silicon nitride is deposited in operation 115 on the substrate. The thin initiation layer may be less than or about 25 Å, less than or about 15 Å, less than or about 10 Å or less than or about 5 Å in different embodiments. For a substrate with a silicon-containing top layer, the silicon nitride initiation layer may include silicon from the top layer and/or silicon from a silicon-containing precursor (either directly or indirectly deposited on the substrate). A boron-containing layer (e.g. a boron nitride layer) is formed on the initiation layer in operation 120 and the substrate is removed from the processing chamber (operation 125).

Figure 2:
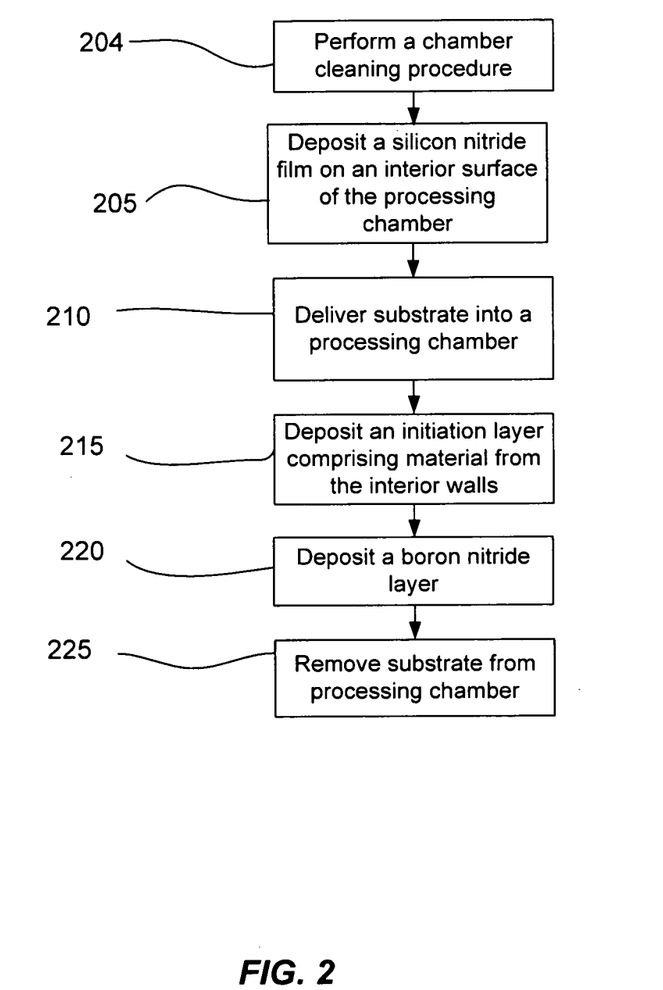
FIG. 2 is a flow chart of a deposition process of a boron-containing bilayer according to disclosed embodiments.

FIG. 2 is another flow chart of a deposition process of a boron-containing bilayer according to disclosed embodiments. Prior to transferring a substrate into a processing chamber, the chamber may be cleaned (operation 204). A silicon nitride film is deposited on interior surface(s) of the processing chamber (operation 205) by striking a plasma in the chamber in the presence of a nitrogen-containing precursor and a silicon-containing precursor. Generally, this is referred to as "seasoning" a chamber when it is done to reduce first-wafer processing effects and may be used for a variety of films in addition to silicon nitride. In this case, an interior surface(s) may be intentionally coated with silicon nitride before transferring each substrate into the chamber. This deposition may be tacked on to the end of the chamber clean recipe. Between the deposition of the silicon nitride on an interior surface and the deposition of silicon nitride onto the substrate, it is preferable to maintain vacuum (or a relatively inert environment) within the processing chamber. Maintaining a vacuum reduces additional oxygen content of the material on the interior surface and ultimately reduces the oxygen content within the initiation layer.

The substrate is delivered to the processing chamber in operation 210. Material from the walls is transferred to the surface of the substrate (operation 215) to form the initiation layer by forming a plasma in the processing chamber. The plasma may be created by applying electrical power (e.g. at RF frequencies) while flowing relatively inert gases (such as nitrogen ($N_2$), hydrogen ($H_2$), helium (He), argon (Ar), or xenon (Xe)) into the processing region. Though these gases may be predominantly inert, the initiation layer may incorporate some of the inert gas especially when nitrogen and/or hydrogen are used. Once again, the initiation layer may be about 25 Å or less, about 15 Å or less, about 10 Å or less or about 5 Å or less in disclosed embodiments. This type of deposition may be referred to herein as an indirect deposition of an initiation layer to distinguish it from a process which deposits a layer directly on the substrate surface. Following the indirect deposition of the initiation layer, a boron-containing layer is formed in operation 220 and then the substrate may be removed from the processing chamber (operation 225).

A benefit of growing an initiation layer by seasoning the chamber first (rather than depositing the initiation layer directly onto the substrate) is that the thickness can be better controlled even for very thin films. Very thin initiation layers (down to about 5 Å) are sometimes desirable so that the bilayer properties are determined mostly by the liner layer and especially when filling narrow high-aspect-ratio trenches. In exchange for the additional control of the thickness of thin initiation layers, the composition stoichiometry is somewhat more difficult to predict or control.

The thickness of material on the interior surface may be greater than the thickness deposited on the substrate. The interior surface may be any surface near the surface of the substrate and may be a showerhead in some embodiments. The thickness of material deposited on the showerhead during the first step of the indirect deposition process may be between about 100 Å and about 2000 Å or between about 600 Å and about 1000 Å in disclosed embodiments and only a portion of the material may be transferred to the substrate in the second step (redeposition) of the indirect deposition process. Much of the material may be pumped away through the exhaust manifold but some may remain on the showerhead and/or other interior surface(s). Any remaining material may be removed during the subsequent cleaning cycle, in embodiments, and new material is deposited on the interior surface(s) before processing the next substrate.

Initiation layers grown with methods according to disclosed embodiments may contain nitrogen and boron with a higher atomic concentration of nitrogen than boron. This type of boron nitride film is called a nitrogen-rich boron nitride film. A nitrogen-rich boron nitride initiation layer bonds the boron within the initiation layer more tightly and reduces the mobility of the boron within the film. A nitrogen-rich boron nitride layer containing an atomic nitrogen content greater than about 53%, greater than about 56% or greater than about 58% may be used to form the initiation layer in disclosed embodiments.

Initiation layers grown with methods according to disclosed embodiments may contain nitrogen and/or carbon. Both carbon and nitrogen atoms are small and are capable of forming strong chemical bonds within a layer. Without intending to be bound to a specific theoretical mechanism, these properties may help to inhibit diffusion of various species across a layer containing a significant portion of nitrogen, carbon or a combination of the two. Nitrogen has been found to inhibit boron diffusion similar to than carbon, but at lower concentrations. Initiation layers may have an atomic nitrogen concentration greater than about 10%, greater than about 20% or greater than about 30% in disclosed embodiments. Initiation layers may have an atomic boron concentration of less than about 47%, less than about 44%, less than about 42%, less than about 30%, less than about 20% or less than about 10% in disclosed embodiments. Initiation layers may also have an atomic carbon concentration greater than about 10%, greater than about 20% or greater than about 30% in disclosed embodiments.

Since carbon and nitrogen can coexist and fulfill similar roles, initiation layers may also have an atomic nitrogen concentration and an atomic carbon concentration which add up to greater than about 10%, greater than about 20% or greater than about 30% in disclosed embodiments. Exemplary materials which may be used to form initiation layers according to disclosed embodiments are silicon nitride, silicon oxynitride, silicon carbide, boron carbon nitride and nitrogen-rich boron nitride. Initiation layers may also have an atomic silicon concentration greater than about 10%, greater than about 20% or greater than about 30% in disclosed embodiments. Additional elements which may be found in an initiation layer include fluorine and hydrogen.

Figure 3:
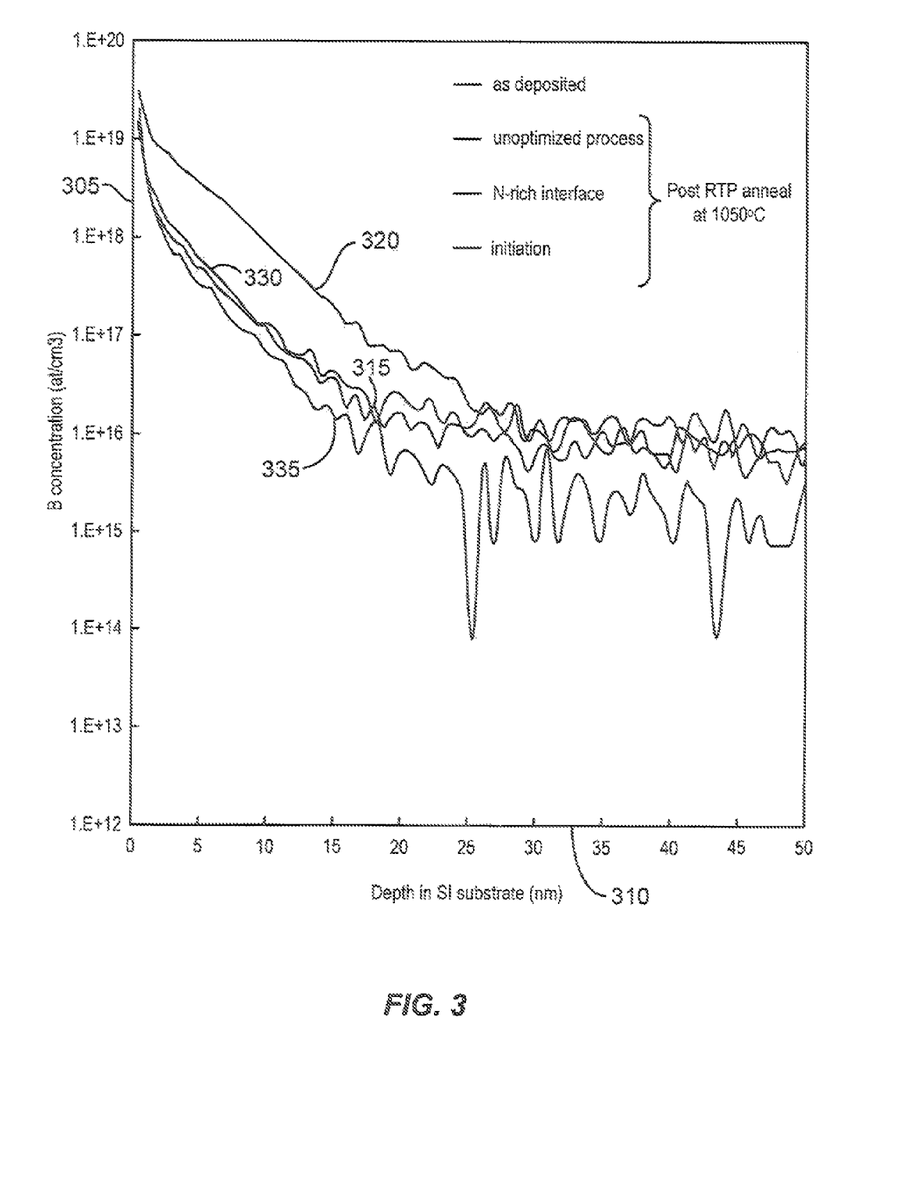
FIG. 3 is a graph of boron concentration after diffusion from a boron-containing bilayer, grown according to disclosed embodiments, into an underlying substrate after heating the substrate to 1050° C.

FIG. 3 is a graph of boron concentration after diffusion from a boron-containing bilayer, grown according to disclosed embodiments, into an underlying silicon substrate. The horizontal axis 310 is depth below the interface of the boron-containing bilayer (in nm) and the vertical axis 305 is the atomic concentration of boron shown using a logarithmic scale. A boron profile is shown (curve 335) for a boron nitride/substrate stack which was not annealed to 1050° C. Curve 335 is useful as a reference curve since the boron profile will be minimal due to low mobility within a substrate maintained at relatively low temperature. The boron concentration varies from about $1 \times 10^{16}$ at/cm$^3$ at a depth of 15 nM to $3 \times 10^{17}$ at/cm$^3$ at a depth of 3 nm For contrast, a curve 320 is also shown for a boron nitride liner layer formed directly on a substrate at 400° C. following a rapid thermal anneal (RTA or RTP anneal) to 1050° C. The boron concentration varies from about $1 \times 10^{17}$ at/cm$^3$ (atoms per cubic centimeter) at a depth of 15 nm to $4 \times 10^{18}$ at/cm$^3$ at a depth of 3 nm. The layer/substrate exhibits a high amount of boron diffusion due to the absence of an initiation layer serving as a barrier at the interface between the substrate and the liner layer.

A boron nitride layer formed with a nitrogen-rich boron nitride interface (roughly 5 Å thick) between the substrate and the "bulk" boron nitride is shown by curve 315 following an RTP anneal to 1050° C. Also shown is a quantitatively similar curve 330 resulting from a bulk boron nitride layer formed on a 5 Å initiation layer of silicon nitride layer created by an indirect deposition process onto the substrate. Both curves (315 and 330) indicate a boron concentration which varies from about $2 \times 10^{16}$ at/cm$^3$ at a depth of 15 nm to $5 \times 10^{17}$ at/cm$^3$ at a depth of 3 nm, quantities more similar to curve 335 than to curve 320. Thus the incorporation of a thin initiation layer between the boron nitride layer and the substrate reduces the diffusion of boron nitride into the substrate during a high temperature anneal nearly to the levels of an unannealed stack of layers.

Direct Deposition Processes

The ensuing discussion applies to both initiation layers and liner layers unless otherwise indicated. Distinctions between initiation and liner layers will be pointed out. A compositional distinction is that liner layers described herein contain boron whereas the initiation layers may or may not. Initiation layers which have little or no boron content (including silicon carbide, silicon nitride and silicon oxynitride) may be deposited by traditional means or with methods described herein.

A variety of gases are known for growing films which contain nitrogen, carbon, oxygen, boron and silicon. Ammonia is often used as a reactive source of nitrogen for growing nitrogen-containing films, however, hydrazine ($N_2H_4$) has also been used. Source of carbon include methane, ethane and, generally speaking, $C_xH_y$. Oxygen ($O_2$), ozone ($O_3$), nitric oxide (NO), nitrous oxide ($N_2O$), carbon dioxide ($CO_2$), and/or water ($H_2O$) may be used as a source of oxygen. Sources of boron may include diborane ($B_2H_6$), borazine ($B_3N_3H_6$), and alkyl-substituted derivatives of borazine. Common sources of silicon are silane, disilane, trisilylamine (TSA), trimethylsilane (TMS), and silazanes.

An exemplary method of depositing a boron-containing initiation or liner layer will be described while referring to the flow chart of FIG. 4. The example will focus on methods of depositing boron nitride. As shown in operation 405, a boron-containing precursor is introduced into a chamber. In operation 410, a boron-containing film is deposited on a substrate in the chamber from the boron-containing precursor. Then, in operation 415, the boron-containing film is treated to modify the film composition (e.g., to increase the nitrogen content of the film). Treating the boron-containing film in operation 415 comprises exposing the boron-containing film to a nitrogen-containing precursor. The sequential exposure represented in FIG. 4 may be used to deposit many of the other films described herein as well.

Returning to operation 405, the chamber into which the boron-containing precursor is introduced may be any chemical vapor deposition chamber or a plasma-enhanced chemical vapor deposition chamber. Examples of chambers that may be used include the PRODUCER® SE and PRODUCER® GT PECVD chambers, both of which are available from Applied Materials, Inc. of Santa Clara, Calif. The processing conditions provided herein are provided for a 300 mm PRODUCER® SE chamber with two isolated processing regions, with one substrate per processing region. Thus, the flow rates experienced per each substrate processing region and substrate are half of the flow rates into the chamber. Before describing details of deposition processes, it should be noted that other methods can be used to form boron-containing films for use as the initiation and liner layers, methods which may or may not use the sequential exposure represented in FIG. 4. Initiation layers may or may not contain boron and may be deposited by way of simultaneous exposure as well.

The underlying substrate on which the boron-containing bilayer is deposited may be a silicon, silicon-containing, or glass. The substrate may be a bare substrate or have one or more layers of material deposited thereon and/or features formed therein. Exemplary materials deposited thereon may be semiconducting, dielectric and/or metal. Herein, the term "substrate" will be used to describe the underlying substrate or the combination of the underlying substrate and one or more layers formed and possibly patterned thereon.

In operation 405, the boron-containing precursor may be diborane ($B_2H_6$), borazine ($B_3N_3H_6$), or an alkyl-substituted derivative of borazine. The boron-containing precursor may be introduced into the chamber at a flow rate between about 5 sccm and about 50 slm, such as between about 10 sccm and about 1 slm. Typically, the boron-containing precursor is introduced into the chamber with nitrogen ($N_2$), hydrogen ($H_2$), argon (Ar) or a combination thereof as a dilution gas. The dilution gas may be introduced into the chamber at a flow rate between about 5 sccm and about 50 slm, such as between about 1 slm and about 10 slm.

For deposition of the boron-containing film in the absence of a plasma in the chamber, the temperature of a substrate support in the chamber may be set to between about 100° C. and about 1000° C., e.g., between about 300° C. and about 500° C., and the pressure in the chamber may be between about 10 mTorr and about 760 Torr, e.g., between about 2 Torr and about 10 Torr, during the deposition. The boron-containing precursor may be combined with nitrogen-containing, carbon-containing, oxygen-containing and/or silicon-containing precursors and flowed in the chamber at the same time at a flow rate between about 5 sccm and about 50 slm, such as between 10 sccm and about 1 slm.

For deposition of the boron-containing film in the presence of a plasma in the chamber, the temperature of a substrate support in the chamber may be set to between about 100° C. and about 1000° C., e.g., between about 300° C. and about 500° C., and the pressure in the chamber may be between about 10 mTorr and about 760 Torr, e.g., between about 2 Torr and about 10 Torr, during the deposition. The plasma may be provided by RF power delivered to a showerhead electrode and/or a substrate support electrode of the chamber. The RF power may be provided at a power level between about 2 W and about 5000 W, such as between about 30 W and about 1000 W, at a single low frequency of between about 100 kHz up to about 1 MHz, e.g., about 300 kHz to about 400 kHz, or at a power level between about 2 W and about 5000 W, such as between about 30 W and about 1000 W, at a single high frequency of greater than about 1 MHz, such as greater than about 1 MHz up to about 60 MHz, e.g., 13.6 MHz. Alternatively, the RF power may be provided at a mixed frequency including a first frequency between about 100 kHz up to about 1 MHz, e.g., about 300 kHz to about 400 kHz at a power level between about 2 W and about 5000 W, such as between about 30 W and about 1000 W, and a second frequency of greater than about 1 MHz, such as greater than about 1 MHz up to about 60 MHz, e.g., 13.6 MHz, at a power level between about 2 W and about 5000 W, such as between about 30 W and about 1000 W.

Figure 4:
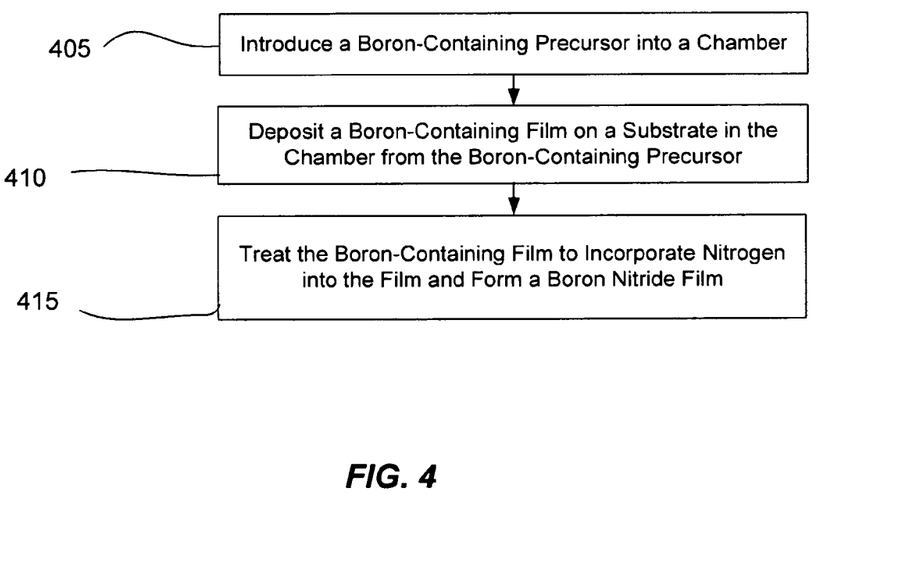
FIG. 4 is a flow chart of a method of forming a boron-nitride layer.

In embodiments, a boron nitride film may be formed in Operation 415 of FIG. 4 by introducing a nitrogen-containing precursor. Examples of nitrogen-containing precursors that may be used include ammonia ($NH_3$), hydrazine ($N_2H_4$). The boron nitride film may have a thickness of between about 2 Å and about 5000 Å.

Other precursors may be used as well including oxygen-containing precursors, silicon-containing precursors, carbon-containing precursors, phosphorous-containing precursors etc. Combinations of precursors may also be used. In some instances these precursors may be present while the boron-containing precursor is in the chamber (not shown in FIG. 4).

Alternatively, the precursors may be introduced into the chamber before or after the introduction of the boron-containing precursor. Examples of oxygen-containing precursors include oxygen ($O_2$), nitric oxide (NO), nitrous oxide ($N_2O$), carbon dioxide ($CO_2$), and water ($H_2O$). Examples of silcon-containing precursors that may be used include silane, trisilylamine (TSA), trimethylsilane (TMS), and silazanes, such as hexamethylcyclotrisilazane (HMCTZ). Examples of carbon-containing precursors that may be used include hydrocarbon precursors having the general formula $C_xH_y$, such as alkanes, alkenes, and alkynes. An example of a phosphorous-containing precursor that may be used is phosphine ($PH_3$). Films may be deposited on the substrate in the chamber from the boron-containing precursor in the presence or absence of a plasma in the chamber. The films may have a thickness of between about 2 Å and about 5000 Å.

Operation 415 may also include a treatment to modify the composition of the boron nitride film by incorporating nitrogen into the film and form a boron nitride film. The treatment is selected from the group consisting of a plasma process, an ultraviolet (UV) cure process, a thermal anneal process, and combinations thereof, and comprises exposing the boron-containing film to a nitrogen-containing precursor to incorporate nitrogen into the film and form the boron nitride fim. The nitrogen-containing precursor may be nitrogen gas ($N_2$), ammonia ($NH_3$), or hydrazine ($N_2H_4$), for example. The nitrogen-containing precursor may be diluted with a dilution gas such as argon, helium, hydrogen, or xenon.

In embodiments in which the treatment comprises a plasma process, the plasma process may be performed in the same chamber in which the boron-containing film was deposited or a different chamber. The plasma may be provided by RF power delivered to a showerhead electrode and/or a substrate support electrode of the chamber. The RF power may be provided at a power level between about 2 W and about 5000 W, such as between about 30 W and about 1000 W, at a single low frequency of between about 100 kHz up to about 1 MHz, e.g., about 300 kHz to about 400 kHz, or at a power level between about 2 W and about 5000 W, such as between about 30 W and about 1000 W, at a single high frequency of greater than about 1 MHz, such as greater than about 1 MHz up to about 60 MHz, e.g., 13.6 MHz. Alternatively, the RF power may be provided at a mixed frequency including a first frequency between about 100 kHz up to about 1 MHz, e.g., about 300 kHz to about 400 kHz at a power level between about 2 W and about 5000 W, such as between about 30 W and about 1000 W, and a second frequency of greater than about 1 MHz, such as greater than about 1 MHz up to about 60 MHz, e.g., 13.6 MHz, at a power level between about 2 W and about 5000 W, such as between about 30 W and about 1000 W. The nitrogen-containing precursor may be introduced into the chamber at a flow rate of between about 5 sccm and about 50 slm, such as between about 100 sccm and about 500 sccm, during the treatment. The nitrogen-containing precursor may be flowed into the chamber for a period of time, such as between about 1 second and about 2 hours, such as between about 1 second and about 60 seconds. The chamber pressure may be between about 10 mTorr and about 760 Torr, and the temperature of a substrate support in the chamber may be between about 20° C. and about 1000° C. during the treatment. Increased high frequency RF power, increased $NH_3$ flow rates, and longer treatment times of the plasma process can be used to adjust the etch rate of the films.

In embodiments in which the treatment comprises a UV cure process, the UV cure process may be performed in the same chamber as the deposition chamber or in a chamber which is part of an integrated tool that includes the deposition chamber in which the boron-containing film was deposited. For example, the UV cure process may be performed in a NANOCURE™ chamber that is part of a PRODUCER® platform that includes a PECVD chamber in which the boron-containing film is deposited.

Exemplary UV cure process conditions that may be used include a chamber pressure of between about 10 mTorr and about 760 Torr and a substrate support temperature of between about 20° C. and about 1000° C. The nitrogen-containing precursor may be introduced into the chamber at a flow rate of between about 5 sccm and about 50 sccm during the treatment. The nitrogen-containing precursor may be flowed into the chamber for a period of time such as between about 1 second and about 2 hours, such as between about 1 second and about 10 minutes. The UV radiation may be provided by any UV source, such as mercury microwave arc lamps, pulsed xenon flash lamps, or high-efficiency UV light emitting diode arrays. The UV radiation may have a wavelength of between about 170 nm and about 400 nm, for example. The treatment may comprise exposing the boron-containing film to between about 1 Watt/$cm^2$ and about 1000 Watts/$cm^2$ of ultraviolet radiation, and the ultraviolet radiation may provide a photon energy between about 0.5 eV and about 10 eV, such as between about 1 eV and about 6 eV.

Typically, the UV cure process removes hydrogen from the film, which is desirable as hydrogen can diffuse through the film and into semiconducting regions of the substrate and degrade reliability of a device formed on the substrate. The UV cure process also typically increases the density of the film and reduces the etch rate.

The treatment processes described herein may be performed in the same chamber in which the film (e.g. the boron-containing film) was deposited or in a different chamber.

A boron nitride layer may be made nitrogen rich in order to perform the functions of a barrier to boron diffusion and thereby make the layer suitable for use as an initiation layer. A boron nitride layer formed according to the flow chart of FIG. 4 may be made nitrogen-rich by modifying process parameters of operation 415. Specifically, the duration of the chemical exposure or cure can be extended. The flow rate of the nitrogen-containing-precursor can be increased. The cure step can be intensified by raising the temperature, increasing the intensity of the radiation, and/or varying the spectral distribution of UV light generally towards shorter wavelengths. If plasma excitation is used in operation 415, it is also possible to increase the plasma power level to increase nitrogen content.

While a substrate is exposed to the boron-containing precursor and the nitrogen-containing precursor sequentially in the embodiments described with respect to FIG. 4, in alternative embodiments, a substrate is exposed to the boron-containing precursor and the nitrogen-containing precursor simultaneously. Generally speaking, simultaneous exposure allows greater film growth rates but may sacrifice some ability to control the properties and thickness of thin boron nitride films. In such embodiments, the boron-containing precursor and the nitrogen-containing precursor are introduced into a chamber and then reacted to chemically vapor deposit a boron nitride film on a substrate in the chamber.

The formation of a film of boron nitride was exemplary. Generally speaking the films of the bilayer include an initiation layer capable of performing as a barrier to keep boron within the bilayer from diffusing into the underlying substrate. Boron-containing precursors, nitrogen precursors, silicon-containing precursors, oxygen-containing precursors, carbon-containing precursors, phosphorous-containing precursors and combinations thereof may also be introduced into the chamber at the same time to deposit an initiation and/or liner layer. The reaction of various precursors may be performed in the presence or absence of a plasma in the chamber.

In embodiments, heterogeneous initiation layers may be formed from simultaneous exposure of a substrate to silane and ammonia at flow rates along with process conditions outlined above with RF plasma excitation. The resulting first portion of an initiation layer is silicon nitride (SiN) which forms a barrier to diffusion into and out of the substrate. Without turning off the plasma or process gas flows, diborane may be added to the processing region to grow a second portion of the initiation layer composed of silicon boron nitride (SiBN). This has been found to promote adhesion between a subsequently deposited boron nitride layer and the substrate especially in regions with exposed metal (e.g. copper) prior to the deposition of the initiation layer. The silicon nitride layer may be about 3 Å-10 Å and the silicon boron nitride layer may be about 3 Å-10 Å thick in different embodiments. The term "initiation layer" is used herein to refer to both heterogeneous initiation layers and homogeneous initiation layers. The heterogeneous initiation layer just described is exemplary and other materials may be deposited with other processes and precursors to form different heterogeneous initiation layers.

Indirect Deposition Processes

The ensuing discussion applies to initiation layers which form barriers to diffusion into and out of the underlying substrate. Initiation layers may or may not contain boron. Initiation layers which have little or no boron content (including silicon carbide, silicon nitride and silicon oxynitride) may be deposited by traditional means or with methods described herein.

A variety of gases are available for growing films which contain nitrogen, carbon, oxygen, boron and silicon. Ammonia may be used as a reactive source of nitrogen for growing nitrogen-containing films, however, hydrazine ($N_2H_4$) can also be used. Source of carbon include methane, ethane and, generally speaking, $C_xH_y$. Oxygen ($O_2$), ozone ($O_3$), nitric oxide (NO), nitrous oxide ($N_2O$), carbon dioxide ($CO_2$), and/or water ($H_2O$) may be used as a source of oxygen. Sources of boron may include diborane ($B_2H_6$), borazine ($B_3N_3H_6$), and alkyl-substituted derivatives of borazine. Common sources of silicon are silane, disilane, trisilylamine (TSA), trimethylsilane (TMS), and silazanes.

Figure 5:
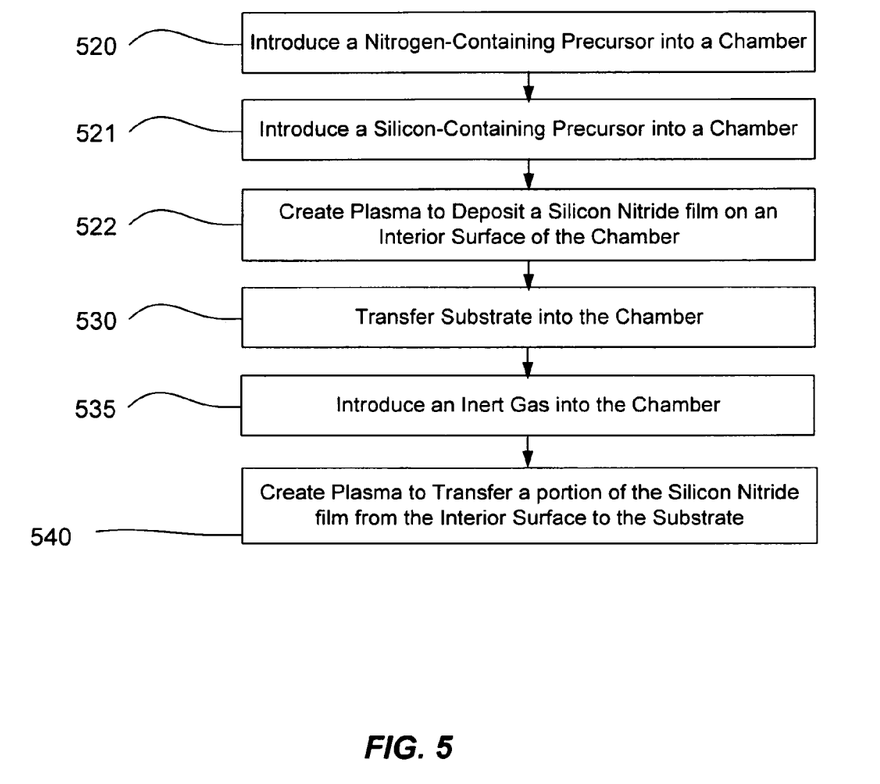
FIG. 5 is a flow chart showing selected steps in a method of depositing an initiation layer according to embodiments of the invention.

An exemplary method of depositing an initiation layer will be described while referring to the flow chart of FIG. 5. The example will focus on methods of depositing silicon nitride. As shown in operations 520-521, a nitrogen-containing precursor and a silicon-containing precursor are introduced into a chamber. In operation 522, a plasma is created to deposit a silicon nitride film on an interior surface of the chamber. No substrate needs to be present during operation 522. Then, in operation 530, a substrate is transferred into the processing chamber. A second plasma is initiated in operation 540 to move some of the silicon nitride from the interior surface of the chamber to the substrate which had been transferred onto an interior surface in operation 530. This indirect method of forming a film may be used for films other than silicon nitride as well, including silicon carbide, silicon oxynitride and nitrogen-rich boron nitride.

The chamber used for operations 520-540 may be a chemical vapor deposition chamber or a plasma-enhanced chemical vapor deposition chamber. Examples of chambers that may be used include the PRODUCER® SE and PRODUCER® GT PECVD chambers, both of which are available from Applied Materials, Inc. of Santa Clara, Calif. The processing conditions provided herein are provided for a 300 mm PRO-DUCER® SE chamber with two isolated processing regions, with one substrate per processing region. Thus, the flow rates experienced per each substrate processing region and substrate are half of the flow rates into the chamber. Before describing details of deposition processes, it should be noted that other methods can be used to form barrier films for use as the initiation and liner layers, methods which may or may not use the indirect deposition technique represented in FIG. 5. Silicon nitride is a material often used in electronics and other methods may be used to deposit a silicon nitride initiation layer, however, the thickness of the film may be more difficult to control.

The underlying substrate on which the boron-containing bilayer is deposited may be a silicon, silicon-containing, or glass. The substrate may be a bare substrate or have one or more layers of material deposited thereon and/or features formed therein. Exemplary materials deposited thereon may be semiconducting, dielectric and/or metal. Herein, the term "substrate" will be used to describe the underlying substrate or the combination of the underlying substrate and one or more layers formed and possibly patterned thereon.

In operation 520, the nitrogen-containing precursor may be diatomic nitrogen ($N_2$), ammonia ($NH_3$), hydrazine ($N_2H_4$) or even ammonium hydroxide ($NH_4OH$) delivered through a bubbler. Combinations of these precursors are also possible. The nitrogen-containing precursor may be introduced into the chamber at a flow rate between about 5 sccm and about 50 slm, such as between about 10 sccm and about 1 slm. Typically, the nitrogen-containing precursor is introduced into the chamber with nitrogen ($N_2$), hydrogen ($H_2$), argon (Ar) or a combination thereof as a dilution gas. The dilution gas may be introduced into the chamber at a flow rate between about 5 sccm and about 50 slm, such as between about 1 slm and about 10 slm.

In operation 521, the silicon-containing precursor may be silane, disilane, trisilylamine (TSA), trimethylsilane (TMS) and/or silazanes. The nitrogen-containing precursor may be introduced into the chamber at a flow rate between about 5 sccm and about 50 slm, such as between about 10 sccm and about 1 slm. Typically, the silicon-containing precursor is introduced into the chamber with nitrogen ($N_2$), hydrogen ($H_2$), argon (Ar) or a combination thereof as a dilution gas. The dilution gas may be introduced into the chamber at a flow rate between about 5 sccm and about 50 slm, such as between about 1 slm and about 10 slm.

Silicon nitride is deposited on an interior surface of the chamber by creating a plasma in the processing chamber in operation 522. For deposition of the initiation layer in the presence of a plasma in the chamber, the temperature of a substrate support in the chamber may be set to between about 100° C. and about 1000° C., e.g., between about 300° C. and about 500° C., and the pressure in the chamber may be between about 10 mTorr and about 760 Torr, e.g., between about 2 Torr and about 10 Torr, during the deposition. The plasma may be provided by RF power delivered to a showerhead electrode and/or a substrate support electrode of the chamber. The RF power may be provided at a power level between about 2 W and about 5000 W, such as between about 30 W and about 1000 W, at a single low frequency of between about 100 kHz up to about 1 MHz, e.g., about 300 kHz to about 400 kHz, or at a power level between about 2 W and about 5000 W, such as between about 30 W and about 1000 W, at a single high frequency of greater than about 1 MHz, such as greater than about 1 MHz up to about 60 MHz, e.g., 13.6 MHz. Alternatively, the RF power may be provided at a mixed frequency including a first frequency between about 100 kHz up to about 1 MHz, e.g., about 300 kHz to about 400 kHz at a power level between about 2 W and about 5000 W, such as between about 30 W and about 1000 W, and a second frequency of greater than about 1 MHz, such as greater than about 1 MHz up to about 60 MHz, e.g., 13.6 MHz, at a power level between about 2 W and about 5000 W, such as between about 30 W and about 1000 W.

Silicon nitride may also be deposited on an interior surface of the chamber in the absence of a plasma in the chamber, the temperature of a substrate support in the chamber may be set to between about 100° C. and about 1000° C., e.g., between about 300° C. and about 500° C., and the pressure in the chamber may be between about 10 mTorr and about 760 Torr, e.g., between about 2 Torr and about 10 Torr, during the deposition.

Regardless of whether a plasma is used to deposit material on an interior surface of the chamber, silicon nitride is not the only material which may be deposited. Other films may be used as the barrier material. Films containing silicon, nitrogen and additional materials are possible. The nitrogen-containing precursor and the silicon-containing precursor may be combined with boron-containing, carbon-containing and/or oxygen-containing precursors and flowed in the chamber at the same time at a flow rate between about 5 sccm and about 50 slm, such as between 10 sccm and about 1 slm.

Following deposition of barrier material on an interior surface of the chamber, a substrate is transferred into the chamber in operation 530. An inert gas is introduced into the chamber in operation 535. Exemplary inert gases may include one or more gases such as nitrogen ($N_2$), hydrogen ($H_2$), helium (He), argon (Ar), or xenon (Xe). Inert gases may be combined with reactive precursors such as those used to coat the interior surface of the chamber. Reactive precursors may then supply material to the initiation layer in addition to the material redistributed from the interior surface. A plasma is created in operation 540 to transfer a portion of the barrier material (silicon nitride in the flow chart) from the interior surface of the chamber to the substrate. The plasma may be provided by RF power delivered to a showerhead electrode and/or a substrate support electrode of the chamber. The RF power may be provided at a power level between about 2 W and about 5000 W, such as between about 30 W and about 1000 W, at a single low frequency of between about 100 kHz up to about 1 MHz, e.g., about 300 kHz to about 400 kHz, at a power level between about 2 W and about 5000 W, such as between about 30 W and about 1000 W, at a single high frequency of greater than about 1 MHz, such as greater than about 1 MHz up to about 60 MHz, e.g., 13.6 MHz. Alternatively, the RF power may be provided at a mixed frequency including a first frequency between about 100 kHz up to about 1 MHz, e.g., about 300 kHz to about 400 kHz at a power level between about 2 W and about 5000 W, such as between about 30 W and about 1000 W, and a second frequency of greater than about 1 MHz, such as greater than about 1 MHz up to about 60 MHz, e.g., 13.6 MHz, at a power level between about 2 W and about 5000 W, such as between about 30 W and about 1000 W.

The inert gas may be introduced into the chamber at a flow rate of between about 5 sccm and about 50 slm, such as between about 100 sccm and about 500 sccm, during the treatment. The inert gas may be flowed into the chamber for a period of time, such as between about 1 second and about 2 hours, such as between about 1 second and about 60 seconds. The chamber pressure may be between about 10 mTorr and about 760 Torr, and the temperature of a substrate support in the chamber may be between about 20° C. and about 1000° C. during the treatment.

A boron nitride layer can be used as an initiation layer and may be made nitrogen rich during the deposition of boron nitride on the interior surface of the chamber. A boron nitride layer formed on the interior surface may be made nitrogen-rich by modifying deposition process parameters. For example, the ratio of the nitrogen-containing precursor to the boron-containing precursor may be increased.

Post deposition treatments similar to those useful for the direct deposition processes of the previous section may find utility in the indirect deposition processes described in this section. These treatments may be used to adjust the properties of the barrier material either while it resides on the interior surface of the chamber or after deposition onto the surface of the substrate. To form a nitrogen-rich boron nitride layer, the duration of the exposure to the nitrogen-containing precursor or the duration of the cure can be extended, the flow rate of the nitrogen-containing-precursor can be increased and/or a plasma power level may be increased.

As used herein "substrate" may be a support substrate with or without layers formed thereon. The support substrate may be an insulator or a semiconductor of a variety of doping concentrations and profiles and may, for example, be a semiconductor substrate of the type used in the manufacture of integrated circuits. A gas in an "excited state" describes a gas wherein at least some of the gas molecules are in vibrationally-excited, dissociated and/or ionized states. A gas may be a combination of two or more gases. The term trench is used throughout with no implication that the etched geometry necessarily has a large horizontal aspect ratio. Viewed from above the surface, trenches may appear circular, oval, polygonal, rectangular, or a variety of other shapes.

Having disclosed several embodiments, it will be recognized by those of skill in the art that various modifications, alternative constructions, and equivalents may be used without departing from the spirit of the disclosed embodiments. Additionally, a number of well known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the dielectric material" includes reference to one or more dielectric materials and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

What is claimed is:

1. A method of depositing a bilayer liner in a trench on a substrate in a processing chamber, the method comprising:
   forming a nitrogen-rich boron nitride layer having a thickness less than or about 15 Å, wherein the nitrogen-rich boron nitride layer consists of boron and nitrogen; and
   forming a boron-containing layer on the nitrogen-rich boron nitride layer;
   wherein the nitrogen-rich boron nitride layer reduces diffusion of boron from the boron-containing layer into the substrate.

2. The method of claim 1 wherein the thickness of the boron-containing layer is less than or about 200 Å.

3. The method of claim 1 wherein the boron-containing layer comprises boron nitride.

4. The method of claim 1 wherein the nitrogen-rich boron nitride layer has an atomic boron concentration of less than about 47% and an atomic nitrogen concentration of greater than about 53%.

5. The method of claim 1 wherein the nitrogen-rich boron nitride layer has an atomic boron concentration of less than about 44% and an atomic nitrogen concentration of greater than about 56%.

6. The method of claim 1 wherein the nitrogen-rich boron nitride layer has an atomic boron concentration of less than about 42% and an atomic nitrogen concentration of greater than about 58%.

7. The method of claim 1, further comprising maintaining a boron concentration within the substrate of less than or about $5 \times 10^{17}$ at/cm$^3$ at a depth of 3 nm or greater within the substrate.

8. A method of depositing a bilayer liner on a surface of a substrate in a processing chamber, the method comprising:
   forming a nitrogen-rich boron nitride layer of barrier material on an interior surface of the processing chamber, wherein the nitrogen-rich boron nitride layer of barrier material consists of boron and nitrogen;
   transferring the substrate into the processing chamber;
   forming a nitrogen-rich boron nitride layer on the substrate by striking a plasma in the processing chamber to redistribute a portion of the barrier material from the interior surface of the processing chamber onto the substrate, wherein the nitrogen-rich boron nitride layer has a thickness less than or about 15 Å; and
   forming a boron-containing layer on the nitrogen-rich boron nitride layer.

9. The method of claim 8 wherein the surface of the substrate comprises a trench.

10. The method of claim 8 wherein the thickness of the boron-containing layer is less than or about 200 Å.

11. The method of claim 8 wherein the boron-containing layer comprises boron nitride.

* * * * *